United States Patent
Ueda et al.

(10) Patent No.: US 8,497,214 B2
(45) Date of Patent: Jul. 30, 2013

(54) SEMICONDUCTOR DEVICE MANUFACTURING METHOD

(75) Inventors: Hirokazu Ueda, Amagasaki (JP); Toshihisa Nozawa, Amagasaki (JP); Takaaki Matsuoka, Tokyo (JP); Akinobu Teramoto, Sendai (JP); Tadahiro Ohmi, Sendai (JP)

(73) Assignees: Tokyo Electron Limited (JP); National University Corporation Tohoku University (JP)

(*) Notice: Subject to any disclaimer, the term of this patent is extended or adjusted under 35 U.S.C. 154(b) by 297 days.

(21) Appl. No.: 12/675,289

(22) PCT Filed: Aug. 7, 2008

(86) PCT No.: PCT/JP2008/064216
§ 371 (c)(1),
(2), (4) Date: Feb. 25, 2010

(87) PCT Pub. No.: WO2009/028314
PCT Pub. Date: Mar. 5, 2009

(65) Prior Publication Data
US 2010/0216300 A1    Aug. 26, 2010

(30) Foreign Application Priority Data
Aug. 31, 2007  (JP) .................... 2007-225224

(51) Int. Cl.
*H01L 21/302*  (2006.01)

(52) U.S. Cl.
USPC .... 438/726; 438/788; 438/792; 257/E21.218; 257/E21.311

(58) Field of Classification Search
USPC .. 438/778, 726–728, 788, 792; 257/E21.218, 257/E21.311
See application file for complete search history.

(56) References Cited

U.S. PATENT DOCUMENTS

2002/0008088 A1* 1/2002 Suzuki et al. ............ 219/121.41
2005/0176263 A1* 8/2005 Sugawara et al. ............ 438/778
2008/0053816 A1* 3/2008 Suzuki et al. ................. 204/164

FOREIGN PATENT DOCUMENTS

| JP | 08-250482 | 9/1996 |
| JP | 09-209156 | 8/1997 |
| JP | 2006-019615 | 1/2006 |
| JP | 2006-244891 | 9/2006 |

OTHER PUBLICATIONS

Korean Office Action—Korean Application No. 10-2009-7026788 issued on May 16, 2011, citing JP 09-209156, JP 2006-244891, and JP 2006-019615.
International Search Report—PCT/JP2008/064216 dated Sep. 2, 2008.

* cited by examiner

*Primary Examiner* — Thanhha Pham
(74) *Attorney, Agent, or Firm* — Cantor Colburn LLP

(57) ABSTRACT

A semiconductor device manufacturing method, the method including: forming a semiconductor element on a semiconductor substrate; and by using microwaves as a plasma source, forming an insulation film on the semiconductor element by performing a CVD process using microwave plasma having an electron temperature of plasma lower than 1.5 eV and an electron density of plasma higher than $1 \times 10^{11}$ cm$^{-3}$ near a surface of the semiconductor substrate.

8 Claims, 19 Drawing Sheets

FIG. 15

SEMICONDUCTOR DEVICE MANUFACTURING METHOD

TECHNICAL FIELD

The present invention relates to a semiconductor device manufacturing method, and more particularly, to a semiconductor device manufacturing method, the method including forming a semiconductor element on a semiconductor substrate, and then forming an insulation layer and a conductive layer on the semiconductor element by using plasma.

BACKGROUND ART

Semiconductor devices, such as large scale integrated circuits (LSI), are manufactured via a plurality of processes, such as etching, chemical vapor deposition (CVD), and sputtering, performed with respect to a silicon substrate. These processes, such as etching, CVD, and sputtering, may use plasma as an energy supply source, that is, may be plasma etching, plasma CVD, and plasma sputtering.

When manufacturing a semiconductor device, plasma processes described above are effectively used along with recent miniaturization or multilayered-wiring of LSI. For example, when performing a plasma process for manufacturing a semiconductor device, such as a metal oxide semiconductor (MOS) transistor, plasma generated by various devices, such as parallel-plate type plasma, inductively-coupled plasma (ICP), or electron cyclotron resonance (ECR) plasma, may be used.

Here, when the plasma process is performed on a silicon substrate (wafer) by using each of the plasma, electric charges are accumulated in a gate oxide film (gate insulation film) or adjacent layer included in a MOS transistor, and thus the MOS transistor has plasma damage, such as a charge-up.

When the MOS transistor has plasma damage, threshold value voltage (Vth) shift deviation or reduced current driving capability is occurred, thereby deteriorating the quality of the semiconductor device. Plasma damage does not occur only in the MOS transistor, but also in other semiconductor devices, such as a charge-coupled device (CCD).

Also, Japanese Laid-Open Patent Publication No. hei 8-250482 discloses such plasma damage.

With respect to the plasma damage, it has been conventionally sought to reduce the plasma damage when manufacturing an LSI circuit by properly designing a circuit, for example, by changing a length of a wire connected to a gate of a transistor so as to reduce an area exposed to plasma, by installing a diode so as to discharge accumulated charges, or the like.

However, as a smaller gate area of a transistor and a thinner film are required according to the development of a technology for minutely processing an LSI circuit, the effect of plasma damage accompanied by accumulation of charges increases. Accordingly, it is difficult to reduce plasma damage just by designing a circuit.

Here, electron density distribution of the plasma generated by parallel-plate, ECR, or ICP is not uniform on a silicon substrate, and thus the amount of the electron density non-uniformity is very large when plasma supply is switched on or off and when a high frequency bias voltage is applied. It is assumed that the plasma damage increases because more charges accumulate on the silicon substrate when a process using plasma having non-uniform electron density distribution is performed.

DISCLOSURE OF THE INVENTION

Technical Problem

To solve the above and/or other problems, the present invention provides a semiconductor device manufacturing method, wherein an effect of plasma damage onto a semiconductor element can be decreased during the manufacture.

Technical Solution

According to an embodiment of the present invention, there is provided a semiconductor device manufacturing method, the method including: forming a semiconductor element on a semiconductor substrate; and by using microwaves as a plasma source, forming an insulation film on the semiconductor element by performing a CVD process using microwave plasma having an electron temperature of plasma lower than 1.5 eV and an electron density of plasma higher than $1\times10^{11}$ $cm^{-3}$ near a surface of the semiconductor substrate.

According to the method of the present invention, a plasma process may be performed for forming a film, after forming a semiconductor element, by using microwave plasma having an electron temperature of plasma lower than 1.5 eV and an electron density of plasma higher than $1\times10^{11}$ $cm^{-3}$. Accordingly, an effect of plasma damage onto the semiconductor element during the manufacturing process may be reduced.

The method may further include performing an etching process using the microwave plasma with respect to the insulation film.

The forming of the semiconductor element may include: forming an insulation film on the semiconductor substrate; forming a conductive layer on the insulation film; and forming an electrode by patterning the conductive layer through an etching process using the microwave plasma.

According to another aspect of the present invention, there is provided a semiconductor device manufacturing method, the method including: forming a semiconductor element on a semiconductor substrate; forming an insulation film on the semiconductor element; and by using microwaves as a plasma source, etching the insulation film by performing an etching process using microwave plasma having an electron temperature of plasma lower than 1.5 eV and an electron density of plasma higher than $1\times10^{11}$ $cm^{-3}$ near a surface of the semiconductor substrate.

According to another aspect of the present invention, there is provided a semiconductor device manufacturing method, the method including: forming a semiconductor element on a semiconductor substrate; forming an insulation film on the semiconductor element; forming a conductive layer on the insulation film; and by using microwaves as a plasma source, patterning the conductive layer by performing an etching process using microwave plasma having an electron temperature of plasma lower than 1.5 eV and an electron density of plasma higher than $1\times10^{11}$ $cm^{-3}$ near a surface of the semiconductor substrate.

According to another aspect of the present invention, there is provided a semiconductor device manufacturing method, the method including: forming a gate insulation film on a semiconductor substrate; by using microwaves as a plasma source, forming a gate electrode on the gate insulation film by performing patterning by an etching process using microwave plasma having an electron temperature of plasma lower than 1.5 eV and an electron density of plasma higher than $1\times10^{11}$ $cm^{-3}$ near a surface of the semiconductor substrate; and forming a pair of highly-concentrated impurity diffusion regions on the semiconductor substrate, wherein the gate insulation film is disposed therebetween.

The method may further include: forming an insulation film on the semiconductor substrate on which the gate electrode is formed; and partly leaving a portion of the insulation film on a side wall of the gate electrode by performing an anisotropic etching process using the microwave plasma on the insulation film.

BRIEF DESCRIPTION OF THE DRAWINGS

FIG. 15 is a diagram showing plasma charge-up damage of a semiconductor device manufactured according to a semiconductor device manufacturing method, according to an embodiment of the present invention;

EMBODIMENTS

Best Mode for Carrying Out the Invention

Hereinafter, the present invention will be described in detail by explaining exemplary embodiments of the invention with reference to the attached drawings.

Figure 1:
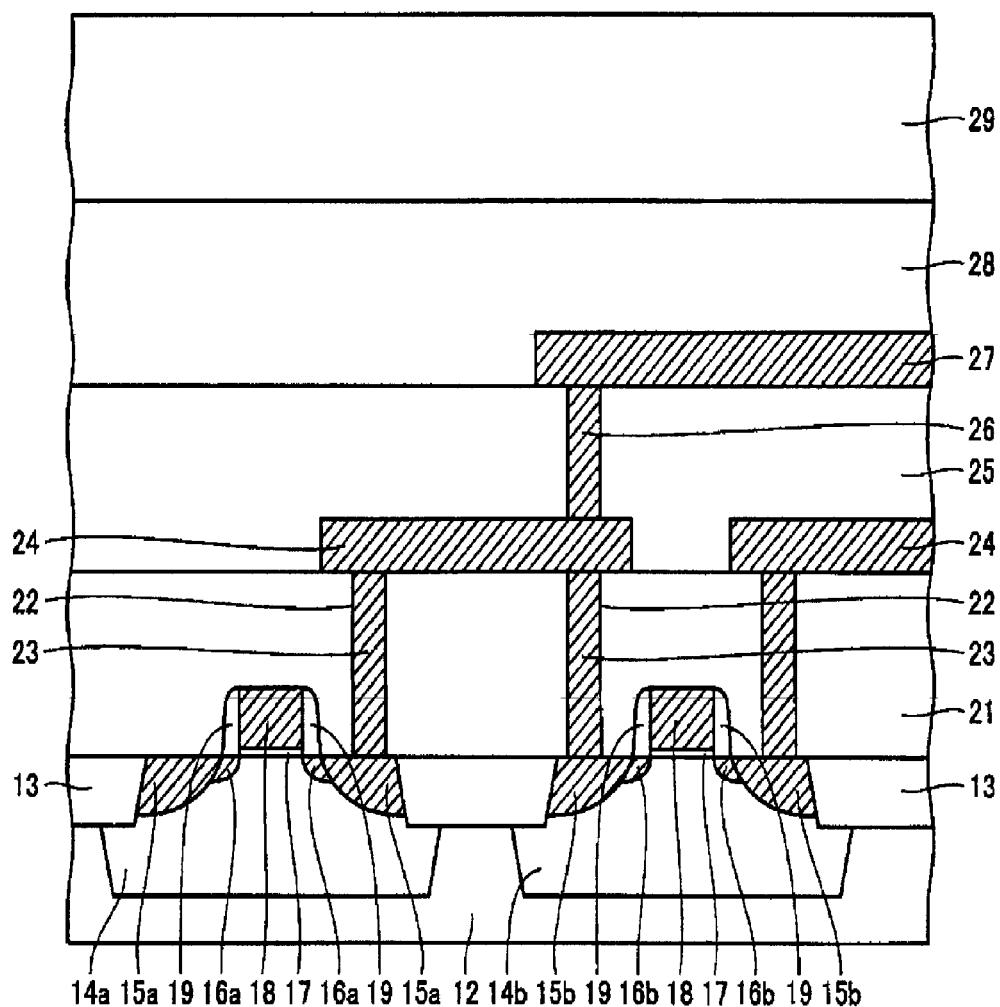
FIG. 1 is a cross-sectional view of a semiconductor device manufactured according to a semiconductor device manufacturing method, according to an embodiment of the present invention.

FIG. 1 is a cross-sectional view of a part of a semiconductor device manufactured according to a semiconductor device manufacturing method, according to an embodiment of the present invention.

According to an embodiment of the present invention, a metal oxide semiconductor transistor (MOS) is described as a semiconductor device and a microwave plasma processing apparatus is explained as a plasma processing apparatus. Also in FIG. 1, conductive layers are shown in hatching.

Referring to FIG. 1, a device isolating region 13, a p-type well 14a, an n-type well 14b, a highly-concentrated n-type impurity diffusion region 15a, a highly-concentrated p-type impurity diffusion region 15b, an n-type impurity diffusion region 16a, and a p-type impurity diffusion region 16b are formed on a silicon substrate 12. Since a method of forming these regions is a well-known method of forming a MOS transistor element, detailed descriptions thereof are omitted herein. A gate oxide film 17 which functions as an insulation layer is formed by using a thermal oxidation method. Also, one of the highly-concentrated n-type impurity diffusion region 15a and the highly-concentrated p-type impurity diffusion region 15b, wherein the gate oxide film 17 is disposed therebetween, is a drain and the other one is a source.

A gate electrode 18 which functions as a conductive layer is formed on the gate oxide film 17 of the MOS transistor element formed as described above. First, a thin film of polysilicon having a thickness of about 3,000 Å is formed on the gate oxide film 17 by using a thermal CVD method. Then, according to an embodiment of the present invention, the gate electrode 18 is formed by patterning the thin film of polysilicon through an etching process using microwave plasma, wherein a mixed gas of $Cl_2$, HBr, and Ar is used as a material gas. As such, by forming the gate electrode 18 through patterning according to the etching process using microwave plasma, plasma damage due to charge-up to the gate oxide film 17 or the like may be reduced.

Then, a silicon oxide (SiO) film which functions as an insulation film with a thickness of about 2,500 Å is formed by using a tetra ethyl ortho silicate (TEOS) through a thermal CVD method. Next, a part of the insulation film is partly left on a side wall of the gate electrode 18 by performing an anisotropic etching process using microwave plasma on the SiO film, wherein a mixed gas of $CF_4$, $CHF_3$, and Ar is used as a material gas. Accordingly, a gate side wall 19 is formed. Plasma damage due to charge-up to the gate oxide film 17 or the like may be reduced just by performing an anisotropic etching process using microwave plasma is performed to form the gate side wall 19.

An interlayer insulation film 21 which functions as an insulation layer is formed on the silicon substrate 12 on which a semiconductor element is formed. A SiO film is formed on a main surface of the silicon substrate 12 by using the thermal CVD method. Then, SiN film having a thickness of about 350 Å is formed through a CVD process using plasma, wherein a mixed gas of $N_2$, $Si_2H_6$, and Ar is used as a material gas. Also, a boro-phospho silicate glass (BPSG) film is formed by using a thermal CVD method or an ozone CVD method. The SiN film operates as a barrier film for boron or phosphorous diffusing from the BPSG film. Then, the BPSG film is reflowed (planarized) at about 850°. Accordingly, the interlayer insulation film 21 is formed. A surface of the BPSG film may be planarization-processed by using a chemical mechanical polishing (CMP) method.

Next, a contact hole 22 standing on the highly-concentrated n-type impurity diffusion region 15*a* or the highly-concentrated p-type impurity diffusion region 15*b* is formed in the interlayer insulation film 21, and an embedded electrode 23 is formed by filling up the contact hole 22. A metal wiring layer 24 which functions as a conductive layer is formed thereon.

First, the contact hole 22 is formed by performing an etching process on the interlayer insulation film 21, wherein a mixed gas of $C_5H_8$, $O_2$, and Ar is used as a material gas. Then, a Ti film having a thickness of about 100 Å is formed inside the contact hole 22 by using a sputtering device, and the embedded electrode 23 is formed on the contact hole 22 by using TiN film through a sputtering method or a W (tungsten) film through a thermal CVD method. Next, an excessive material region is removed by using a CMP method.

Then, the metal wiring layer 24 is formed. First, a Ti film is formed to have a thickness of 100 Å or above, and then a TiN film having a thickness of 200 Å or an aluminum copper wiring film having a thickness of about 5,000 Å is formed on the Ti film through sputtering. Also, as a countermeasure against halation during a photo-processing, a TiN film having a thickness of about 200 Å is formed on the aluminum copper wiring film. Then, the metal wiring layer 24 is formed by performing an etching process using microwave plasma, wherein a mixed gas of $Cl_2$, $BCl_3$, and Ar is used as a material gas.

After forming the metal wiring layer 24, an interlayer insulation film 25 is formed thereon. First, a SiO film with a thickness greater than 5,000 Å is formed through a plasma CVD process using microwave plasma by using a TEOS-$O_2$-based material. During an etching process using microwave plasma, etching is performed by using Ar gas, and planarization is performed. Here, etch-back of about 2,000 Å is performed. Then, a SiO film having a thickness of about 17,000 Å is again formed through a plasma CVD process using microwave plasma by using a TEOS-$O_2$-based material, and then planarization is performed on the interlayer insulation film 25 through a CMP method. During the CMP method, etch-back of about 10,000 Å is performed.

As such, by forming an interlayer insulation film which functions as an insulation layer and a conductive layer 27 alternately, as occasion demands, an embedded electrode 26 is formed. After forming the interlayer insulation film and the conductive layer 27, a SiO film having a thickness of about 8,000 Å is formed as a protective film 28, and a SiN film having a thickness of about 4,000 Å is formed as a protective film 29, through a plasma CVD process using microwave plasma. Finally, a pad unit (not shown) is formed.

In the above-mentioned processes, microwave plasma, wherein an electron temperature of plasma is lower than 1.5 eV and an electron density of plasma is higher than $1 \times 10^{11}$ $cm^{-3}$, is used during the etching process and CVD process both using microwave plasma, by using a microwave as a plasma source.

A method of generating plasma and the characteristics will now be described. Table 1 below shows a discharge condition in order to generate plasma, and electron density and electron temperature of the generated plasma with respect to parallel-plate plasma, ECR plasma, and ICP used in the conventional art, and microwave plasma used in the method of manufacturing a semiconductor device, according to an embodiment of the present invention.

TABLE 1

| Condition | Parallel-Pate | ECR | ICP | Microwave |
|---|---|---|---|---|
| Frequency (Hz) | 50 k~13.5 M | 2.45 G | 1~20 M | 2.45 G |
| Pressure (Torr) | 100 m~1 | 0.5 m~5 m | 0.5 m~10 m | 0.5 m~5 |
| Electron Density ($cm^{-3}$) | ~$1 \times 10^{10}$ | ~$5 \times 10^{12}$ | ~$5 \times 10^{12}$ | ~$5 \times 10^{12}$ |
| Electron Temperature (eV) | 1~15 | 2.5~10 | 2.5~10 | ~1.5 |

Referring to FIG. 1, regarding the parallel-plate plasma, the electron density of plasma is lower than $1 \times 10^{10}$ ($cm^{-3}$) and the electron temperature of plasma is from 1 to 15 eV near a surface of a semiconductor substrate to be processed. Regarding the ECR plasma and ICP, the electron density of plasma is lower than $5 \times 10^{12}$ ($cm^{-3}$), and the electron temperature of plasma is from 2.5 to 10 eV. With respect to the microwave plasma, the electron density of plasma is lower than $5 \times 10^{12}$ ($cm^{-3}$), and the electron temperature of plasma is lower than 1.5 eV. Here, in case of the parallel-plate plasma, the electron temperature of plasma may be decreased to about 1 eV near the surface of the semiconductor substrate, but in this case the electron density of plasma also decreases, and thus a process using plasma cannot be performed.

Figure 2:
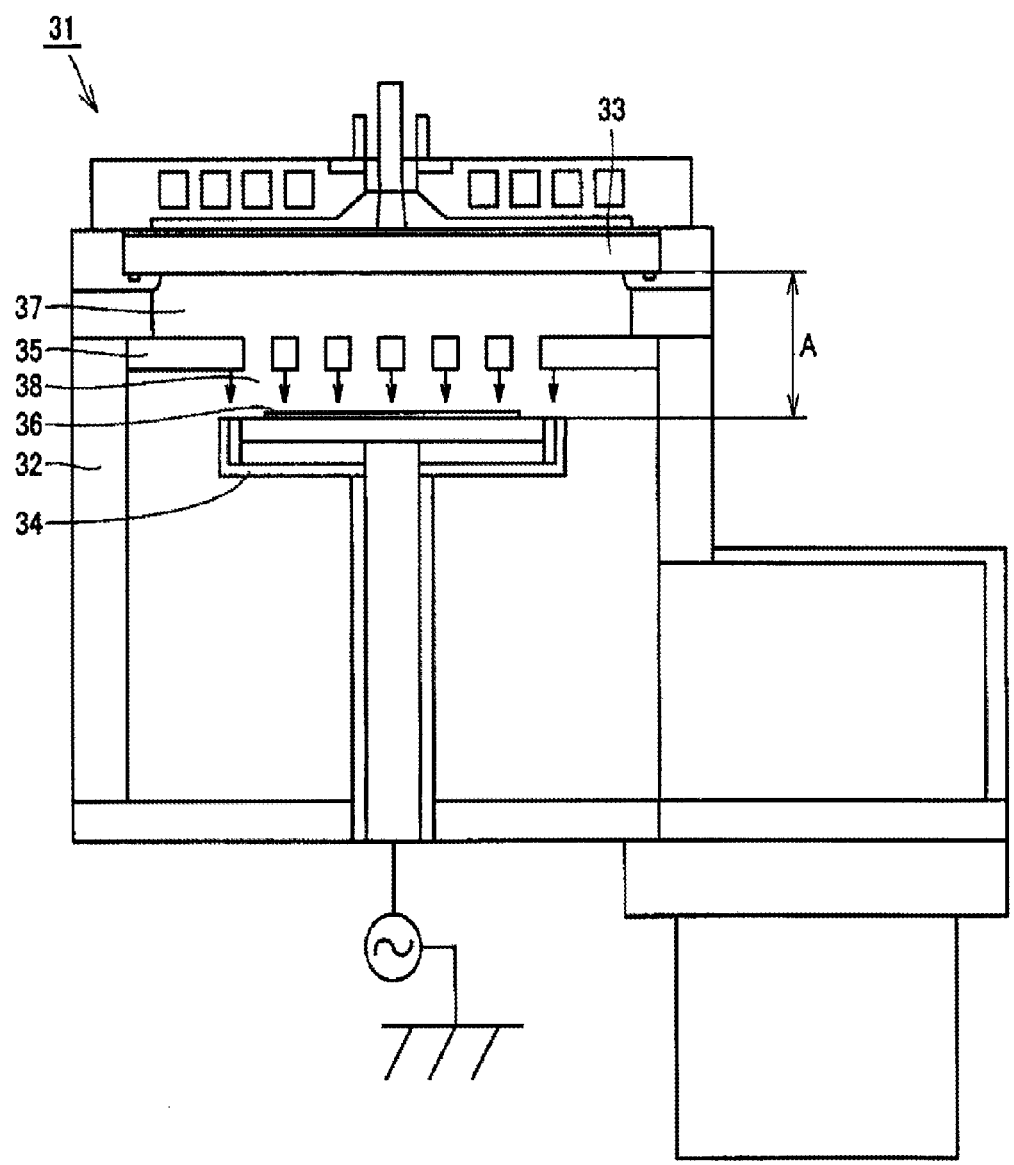
FIG. 2 is a schematic diagram of a plasma processing apparatus used in a semiconductor device manufacturing method, according to an embodiment of the present invention.

FIG. 2 is a schematic diagram of a plasma processing apparatus 31 for performing a process by generating plasma as described above.

Referring to FIG. 2, the plasma processing apparatus 31 includes a sealable chamber 32 for accommodating and processing a silicon substrate 36, and an antenna unit 33 for generating plasma inside the sealable chamber 32 by microwaves fed from a waveguide.

Here, a method of performing a plasma process on the silicon substrate 36 by using the plasma processing apparatus 31 of FIG. 2 will now be briefly described. First, the semiconductor substrate 36 to be processed is placed on a susceptor 34 inside the sealable chamber 32. Next, the inside of the chamber 32 is depressurized until the pressure inside the chamber 32 satisfies the discharge condition of the microwave plasma described above, and then a predetermined bias voltage is applied to the semiconductor substrate 36. Then, microwaves are generated by a high frequency power supply source, and are fed to the antenna unit 33 through the waveguide. As such, plasma is generated in a plasma generating area 37 from the antenna unit 33. The generated plasma reaches a plasma diffusion area 38 through a gas shower head 35, and a CVD process, an etching process, a sputtering process, or the like is performed as the plasma reacts in the plasma diffusion area 38 with a material gas supplied from the gas shower head 35.

The antenna unit 33 includes a slot plate in a disk shape having a plurality of slot holes that are each formed to have a T shape when viewed from below, so as to emit the microwaves fed from the waveguide to the sealable chamber 32 through the plurality of slot holes. As such, plasma having a uniform electron density distribution may be generated.

According to an example of the structure of the plasma processing apparatus 31, for example, a distance between the susceptor 34 on which the semiconductor substrate 36 is placed and the antenna unit 33 may be about 120 mm, and a distance between the susceptor 34 and the gas shower head 35 may be about 40 mm. Also, as a discharge condition, a frequency may be 2.45 GHz, and a pressure may be from 0.5 mTorr to 5 Torr.

Figure 3:
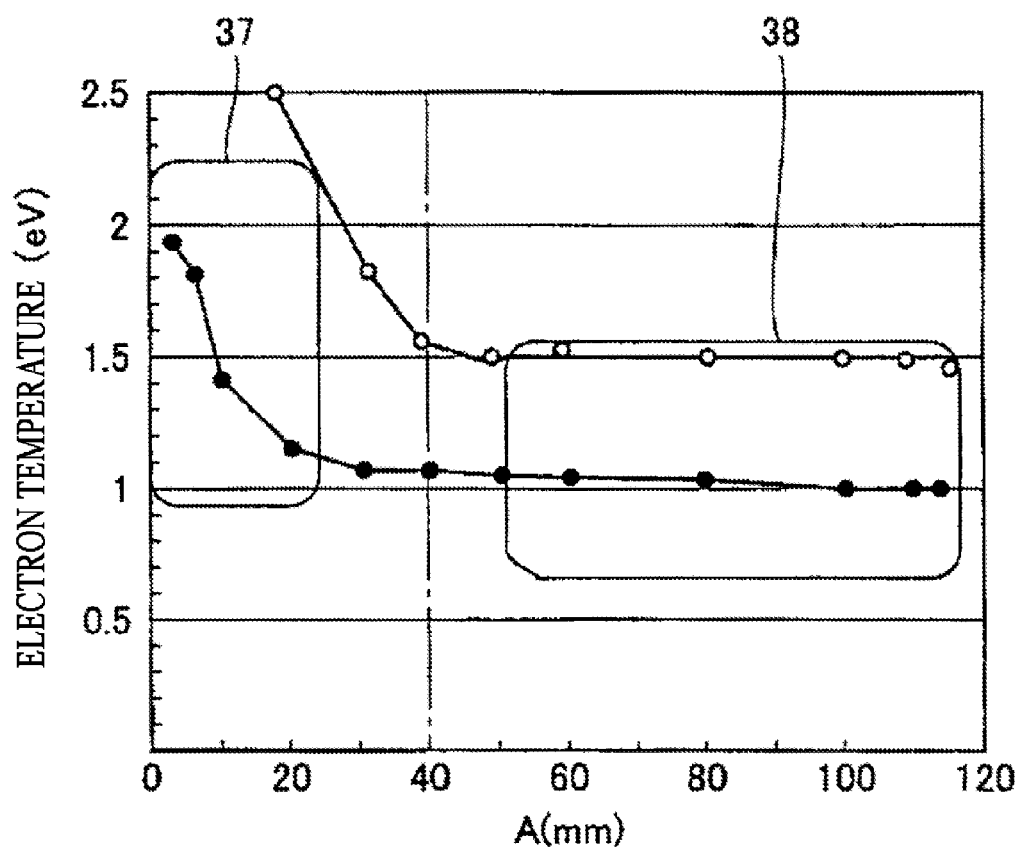
FIG. 3 is a graph showing a relationship between a distance from an antenna unit and electron temperature of plasma in a plasma processing apparatus.
Figure 4:
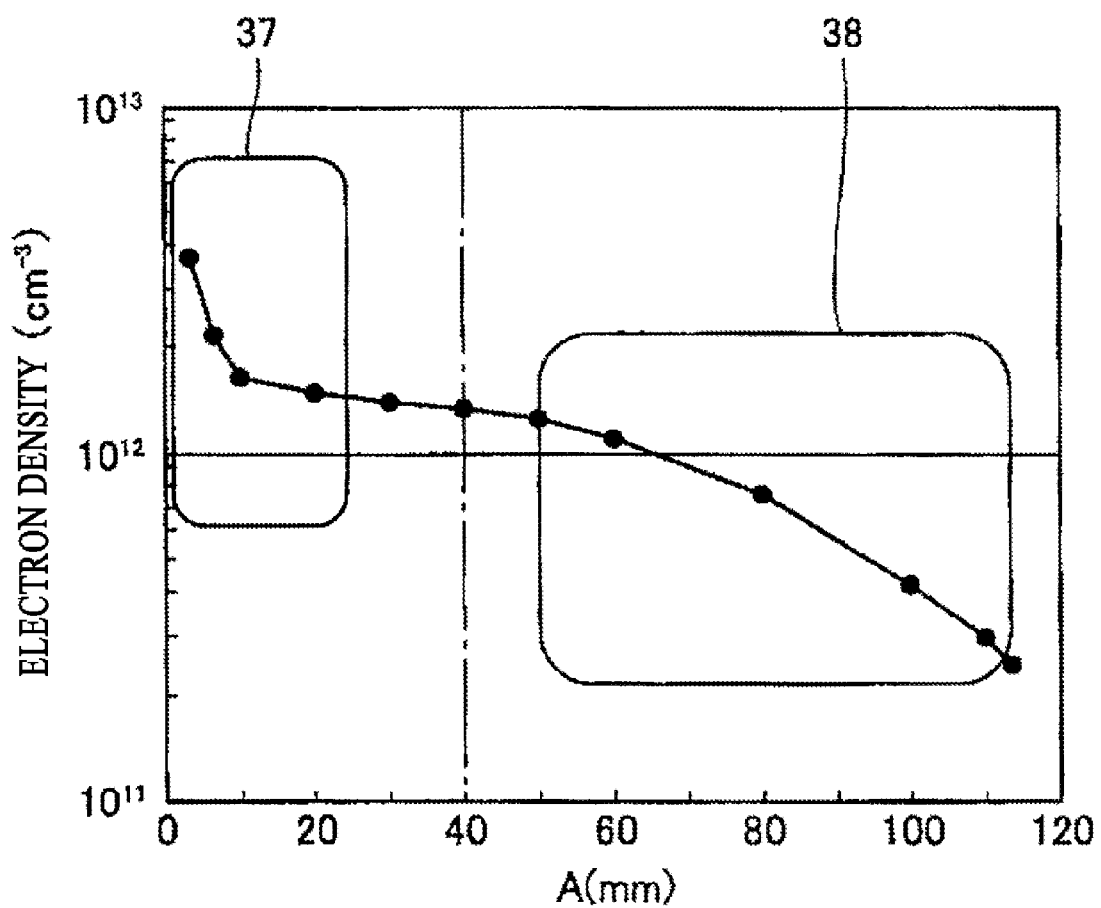
FIG. 4 is a graph showing a relationship between a distance from and an antenna unit and electron density of plasma in a plasma processing apparatus.

FIG. 3 is a graph showing a relationship between a distance A from the antenna unit 33 and electron temperature of plasma in the plasma processing apparatus 31. In FIG. 3, a plot indicated by a line connecting black circles denotes plasma under a high pressure condition, in detail, a pressure lower than 5 Torr, and a plot indicated by a line connecting white circles denotes plasma under a low pressure condition, in detail, a pressure higher than 1 mTorr. Also, FIG. 4 is a graph showing a relationship between the distance A from the antenna unit 33 and electron density of plasma in the plasma processing apparatus 31.

Referring to FIGS. 1 through 4, in the plasma processing apparatus 31 having the above structure, when a downward distance from the antenna unit 33 is A (mm), a range defined by $0 \leq A \leq 25$ is the plasma generating area 37. Also, a range defined by $50 \leq A \leq 120$ is the plasma diffusion area 38. The electron temperature of plasma on the silicon substrate 36 is lower than at least 1.5 eV, within the range of 1 mTorr to 5 Torr as shown in FIG. 3. Also, the electron density of plasma on the silicon substrate 36 is higher than at least $1 \times 10^{11}$ cm$^{-3}$. Accordingly, plasma having low electron temperature and high electron density may be realized.

Figure 5:
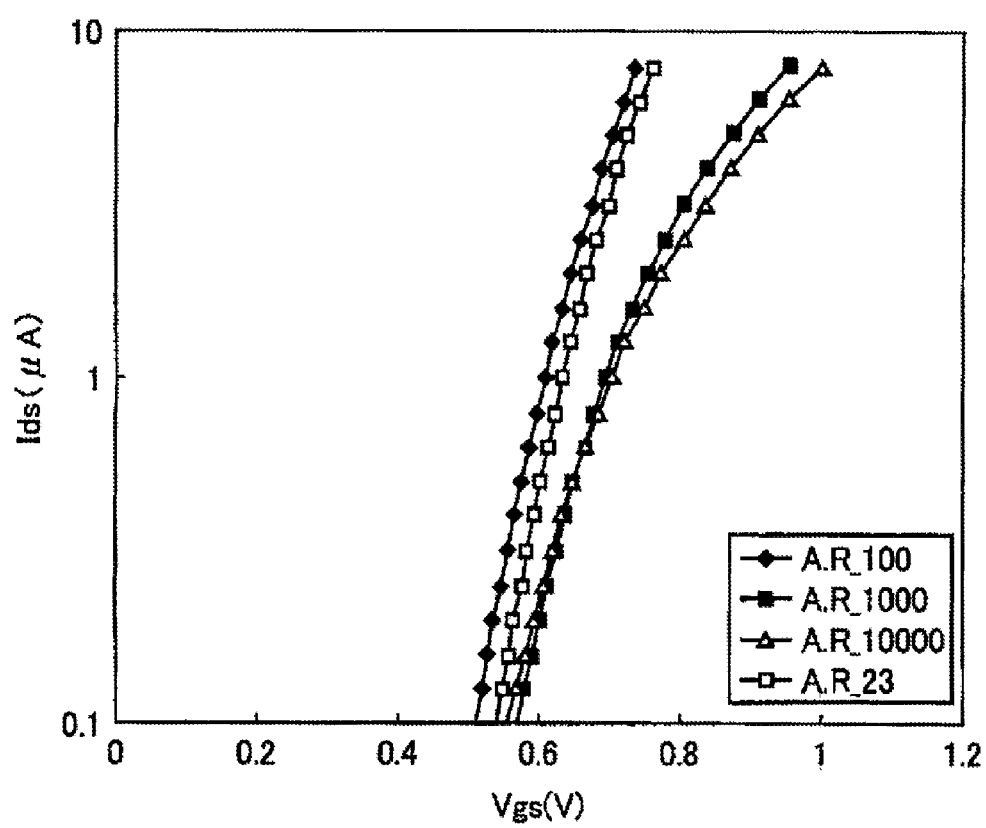
FIG. 5 is a graph showing a relationship between Vgs and Ids, in a semiconductor device manufactured according to a conventional manufacturing method.
Figure 6:
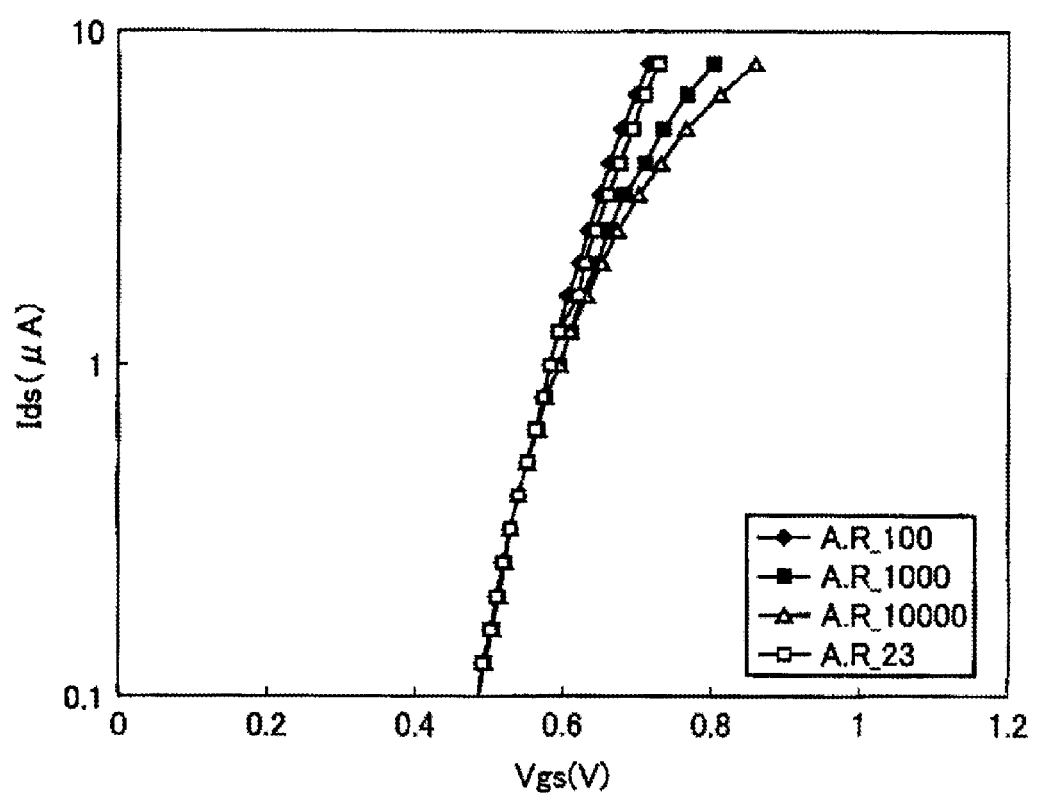
FIG. 6 is a graph showing a relationship between Vgs and Ids, in a semiconductor device manufactured according to a semiconductor device manufacturing method, according to an embodiment of the present invention.

FIG. 5 is a graph showing a relationship between a voltage Vgs between a gate and a source and a current Ids flowing between a drain and the source, in a transistor to be measured, when the transistor is processed with conventional plasma process (ICP). FIG. 6 is a graph showing a relationship between a voltage Vgs between a gate and a source and a current Ids flowing between a drain and the source, in a transistor to be measured with respect to each antenna ratio, when processed with microwave plasma according to an embodiment of the present invention. Here, AR100, AR1000, AR10000, and AR23 denote antenna ratios. The antenna ratio denotes a ratio of a total area of a portion into which charged particles of a wiring of the to-be-measured transistor that is exposed to plasma to an area of a gate electrode connected to the wiring. As the antenna ratio increases, a probability of being exposed to plasma increases.

Changes of the voltage Vgs between a gate and a source and the current Ids flowing between a drain and the source shown in FIGS. 5 and 6 show a driving capability of a MOS transistor. In a semiconductor device processed with conventional plasma process, as shown in FIG. 5, as the antenna ratio increases, the change of the voltage Vgs with respect to the current Ids is large. On the other hand, when processed with the microwave plasma according to an embodiment of the present invention, the change of the current Ids flowing between the drain and the source with respect to the voltage Vgs between a gate and a source is small regardless of the antenna ratio, and the change of the voltage Vgs between a gate and a source increases as the current Ids flowing between the drain and the source increases, as shown in FIG. 6, and thus the driving capability of the MOS transistor improves.

Figure 7:
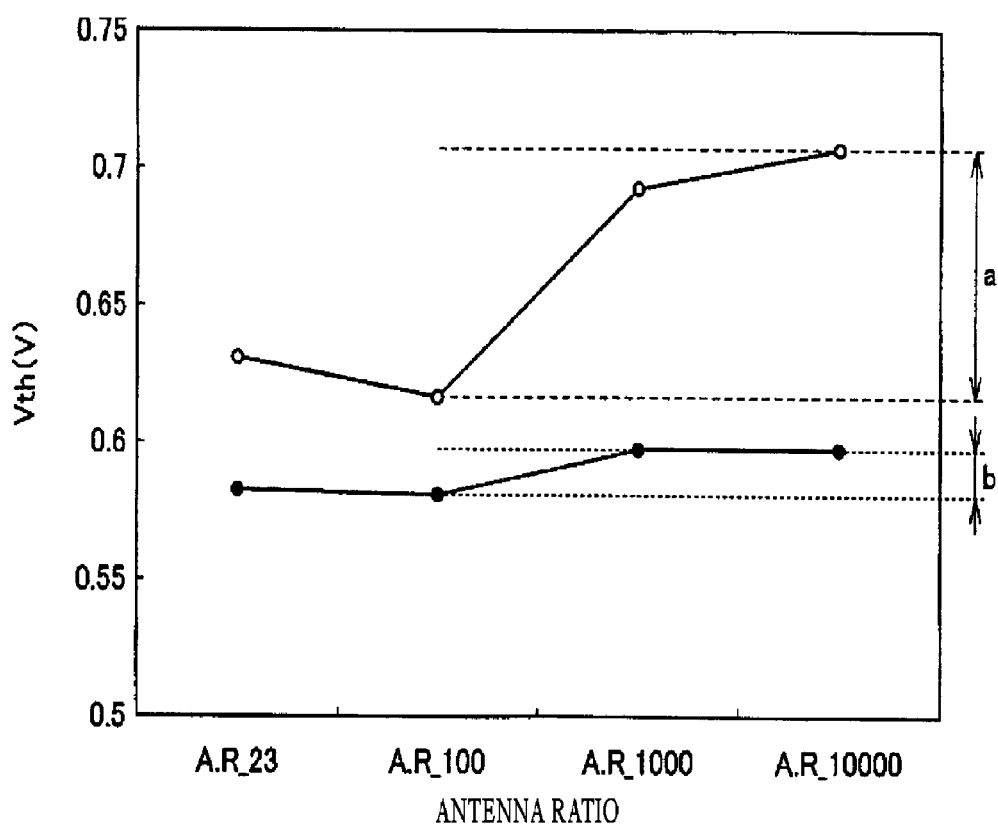
FIG. 7 is a graph showing a relationship between Vth and an antenna ratio, in a semiconductor device manufactured according to a conventional manufacturing method, and in a semiconductor device manufactured according to a semiconductor device manufacturing method according to an embodiment of the present invention.

FIG. 7 is a graph showing a relationship between a threshold value voltage Vth and an antenna ratio, in a semiconductor device manufactured according to a manufacturing method using a conventional process (ICP), and a semiconductor device manufactured according to a manufacturing method using a process with plasma according to an embodiment of the present invention. The threshold value voltage Vth is measured by using TEG 41 that will be described later with reference to FIG. 13. Also, a range indicated by an arrow a in FIG. 7 is Vth shift deviation in the semiconductor device manufactured according to the manufacturing method using the conventional plasma process, and a range indicated by an arrow b in FIG. 7 is Vth shift deviation in the semiconductor device manufactured according to the manufacturing method using the process with microwave plasma according to an embodiment of the present invention. In FIG. 7, the vertical axis indicates the threshold value voltage Vth (V), and the horizontal axis indicates the antenna ratio.

Referring to FIG. 7, in the semiconductor device manufactured according to the manufacturing method using the conventional plasma process, a difference between the threshold value voltage Vth when an antenna ratio is 100 and the threshold value voltage Vth when an antenna ratio is 10000 is Vth shift deviation, which is larger than 0.05 V. Meanwhile, in the semiconductor device manufactured according to the manufacturing method using the process with microwave plasma according to an embodiment of the present invention, a difference between the threshold value voltage Vth when an antenna ratio is 100 and the threshold value voltage Vth when an antenna ratio is 10000 is Vth shift deviation, which is smaller than 0.02 V. Accordingly, the semiconductor device manufactured according to the manufacturing method using the process microwave plasma according to an embodiment of the present invention has smaller Vth shift deviation than the semiconductor device manufactured according to the manufacturing method using the conventional process.

Also, in the above embodiments, the microwave plasma is used during the plasma etching process and the plasma CVD process after forming the semiconductor element, but the present invention is not limited thereto. For example, the microwave plasma may be used only during patterning a conductive layer through an etching process. Alternatively, the microwave plasma may be used only for forming an insulation layer through a CVD process. Alternatively, the microwave plasma may be used only for forming an insulation layer through a CVD process and for patterning a conductive layer through an etching process.

Figure 8:
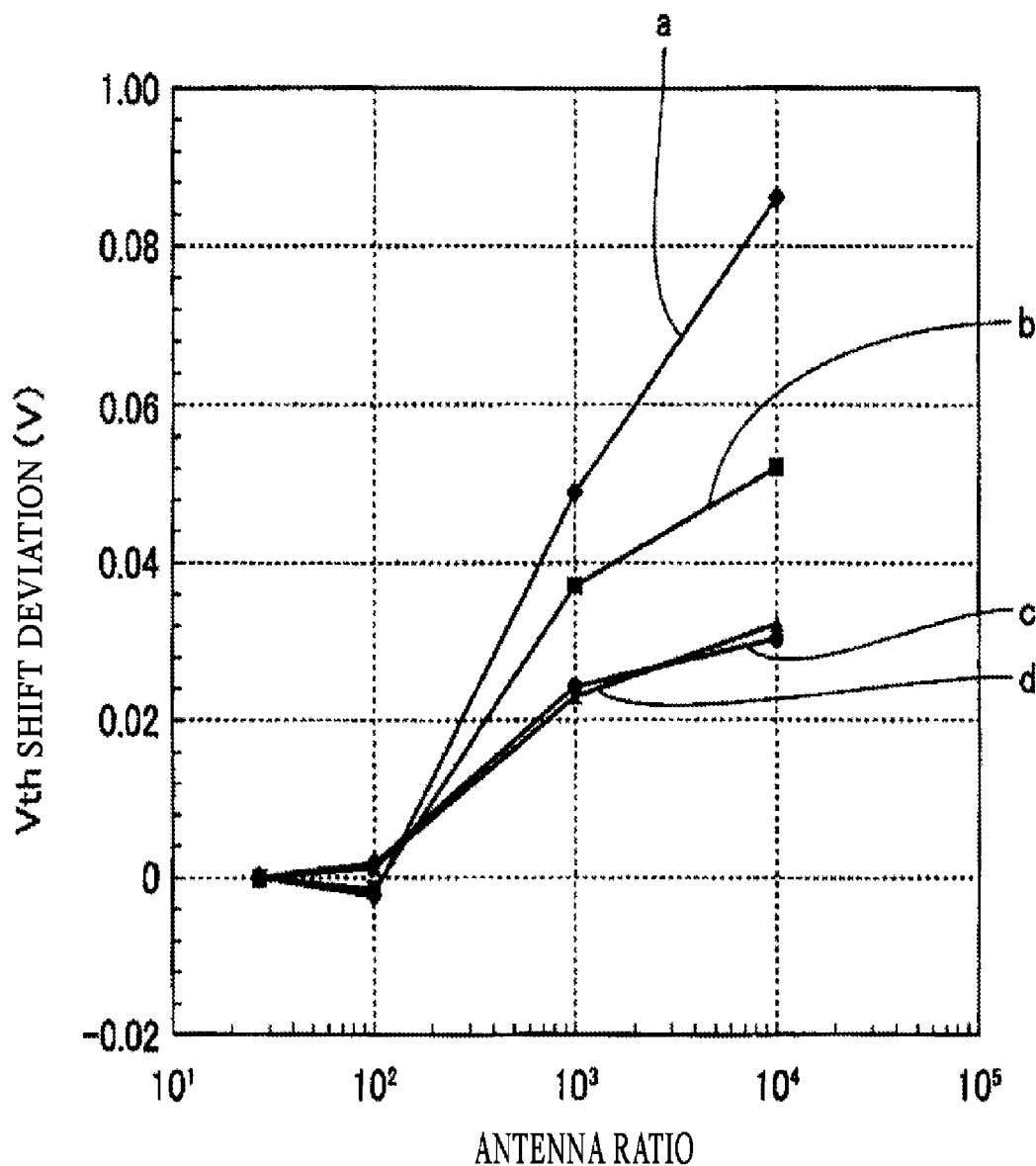
FIG. 8 is a graph showing a relationship between an antenna ratio and Vth shift deviation of a semiconductor device in each manufacturing method.

FIG. 8 is a graph showing a relationship between an antenna ratio and Vth shift deviation of a semiconductor device when processed with conventional plasma process (ICP), and when processed with microwave plasma according to an embodiment of the present invention. In FIG. 8, a plot a denotes an example of a semiconductor device processed with conventional plasma, and plots b, c, and d denote an example of semiconductor devices processed with microwave plasma. In particular, the plot b denotes an example of patterning only the metal wiring layer 24 of the first layer in FIG. 1 by performing an etching process using microwave plasma, the plot c denotes an example of forming only the interlayer insulation film 25 in FIG. 1 by performing a CVD process using microwave plasma, and the plot d denotes an example of performing both operations, i.e., patterning the metal wiring layer 24 of the first layer, by performing an etching process using microwave plasma, and forming the interlayer insulation film 25 by performing a CVD process using microwave plasma. In FIG. 8, the vertical axis denotes Vth shift deviation (V) based on an antenna ratio, and the horizontal axis denotes an antenna ratio.

Referring to FIG. 8, in the plot a corresponding to an example according to the conventional technology, when an antenna ratio is 10000, the Vth shift deviation exceeds 0.08, whereas in the plot b, where only the metal wiring layer 24 is patterned by performing the etching process using microwave plasma, the Vth shift deviation is smaller than 0.06. Also, in the plot c, wherein only the interlayer insulation film 25 is formed by performing the CVD process using microwave plasma, and the plot d, where both operations are performed by using microwave plasma, the Vth shift deviation is smaller than 0.04. As such, the Vth shift deviation may be reduced even by patterning only the metal wiring layer 24 by performing the etching process using microwave plasma. Also, the Vth shift deviation may be reduced even by forming the interlayer insulation film 25 of FIG. 1 by performing the CVD process using microwave plasma. In addition, the Vth shift deviation may be reduced by performing both operations with microwave plasma.

Figure 9:
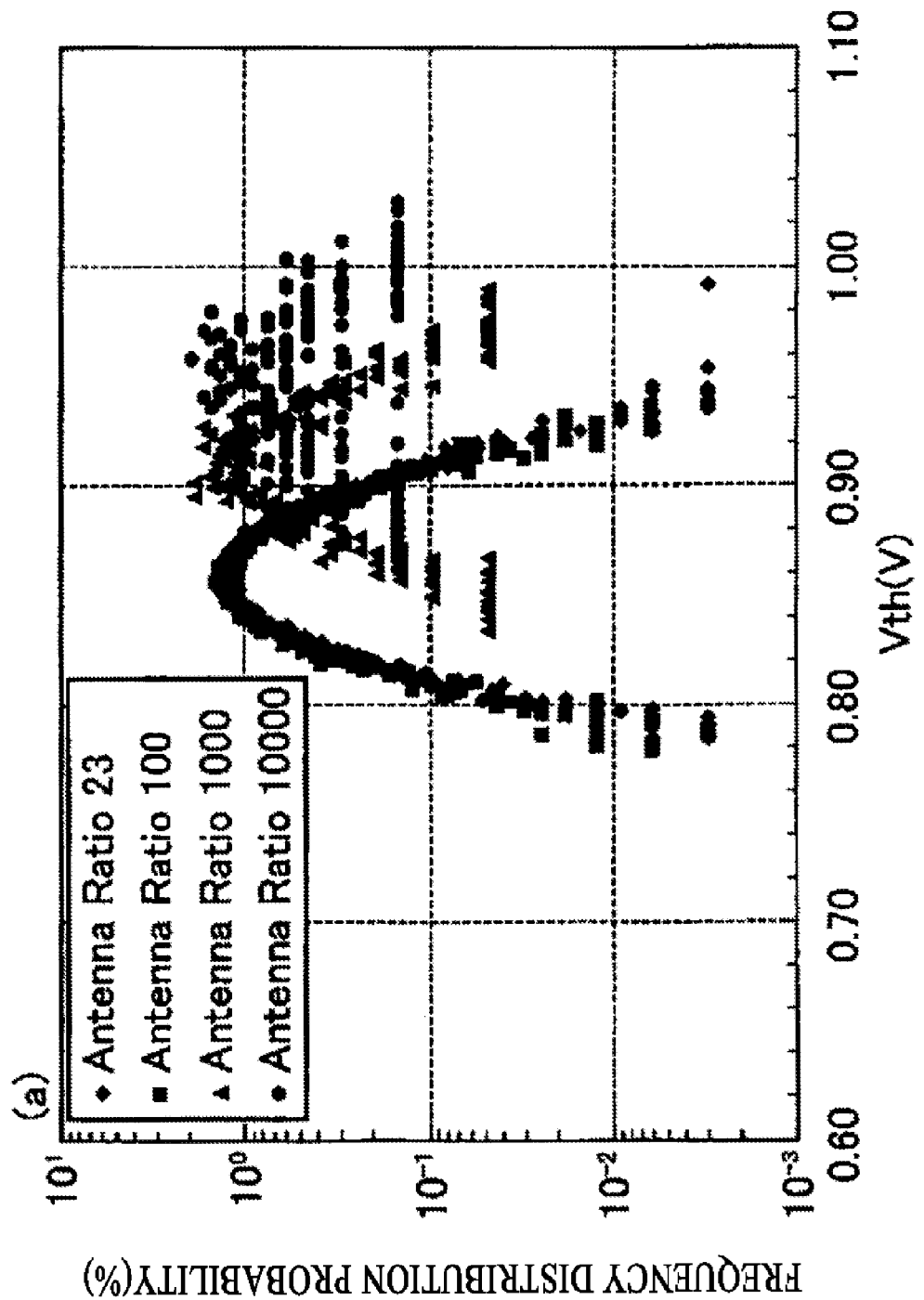
FIG. 9 is a graph showing a relationship between Vth shift deviation and a frequency distribution probability, in each antenna ratio in case of being manufactured according to a conventional manufacturing method (a)
Figure 10:
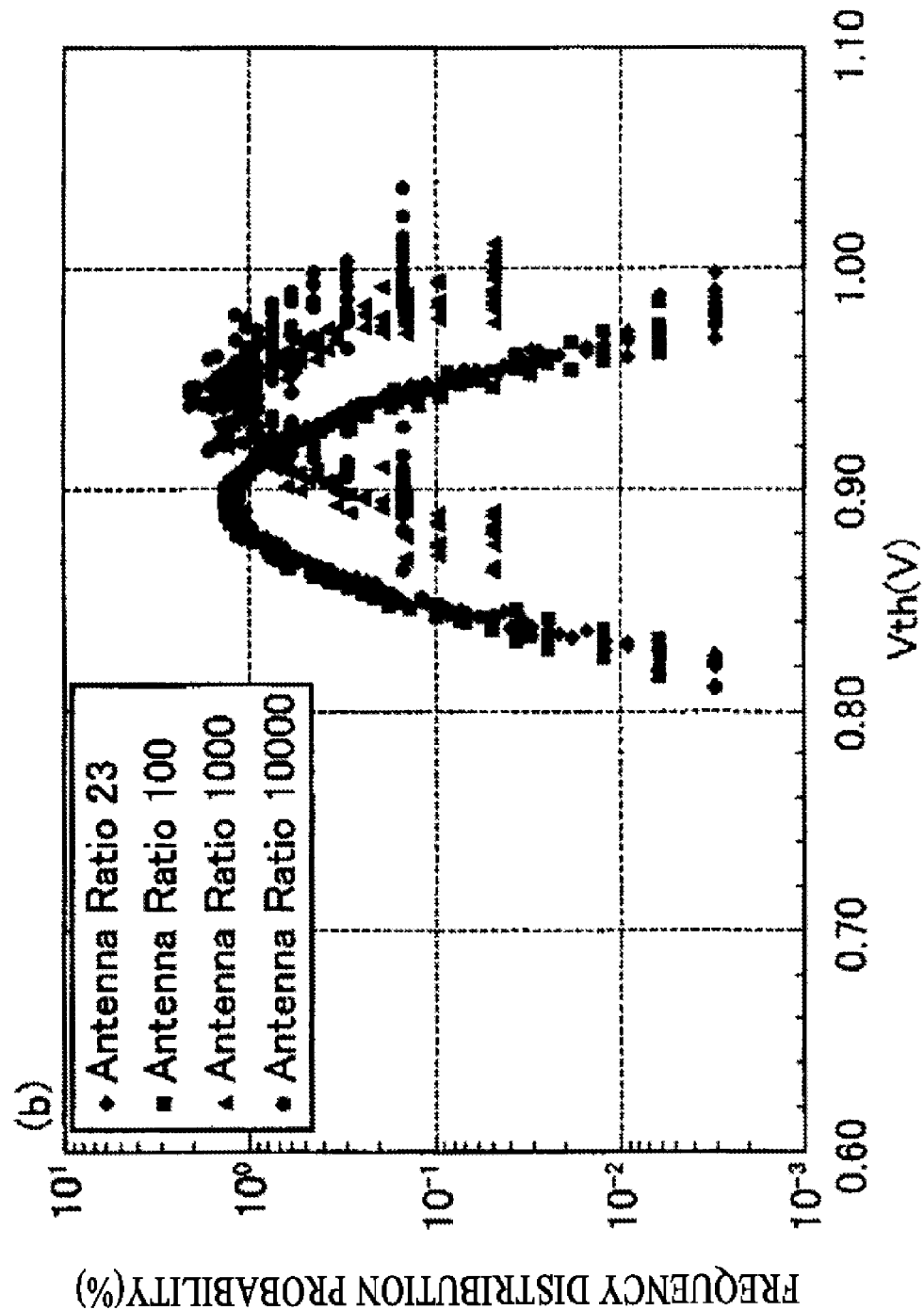
FIG. 10 is a graph showing a relationship between Vth shift deviation and a frequency distribution probability, in each antenna ratio in case of being manufactured according to a manufacturing method (b) of patterning only a metal wiring layer of the first layer through an etching process using microwave plasma.
Figure 11:
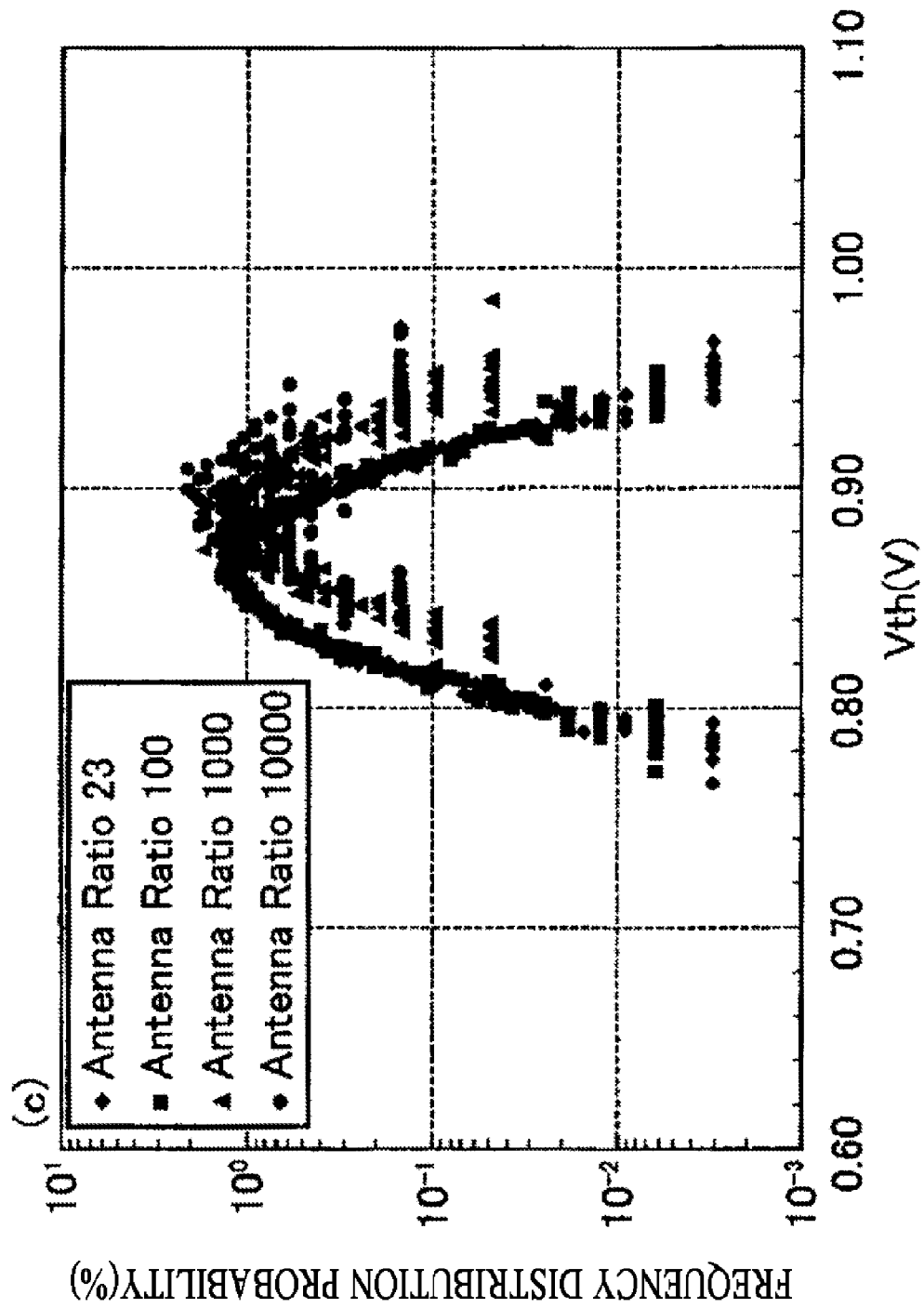
FIG. 11 is a graph showing a relationship between Vth shift deviation and a frequency distribution probability, in each antenna ratio in case of being manufactured according to a manufacturing method (c) of forming only an interlayer insulation film according to a chemical vapor deposition (CVD) process using microwave plasma.
Figure 12:
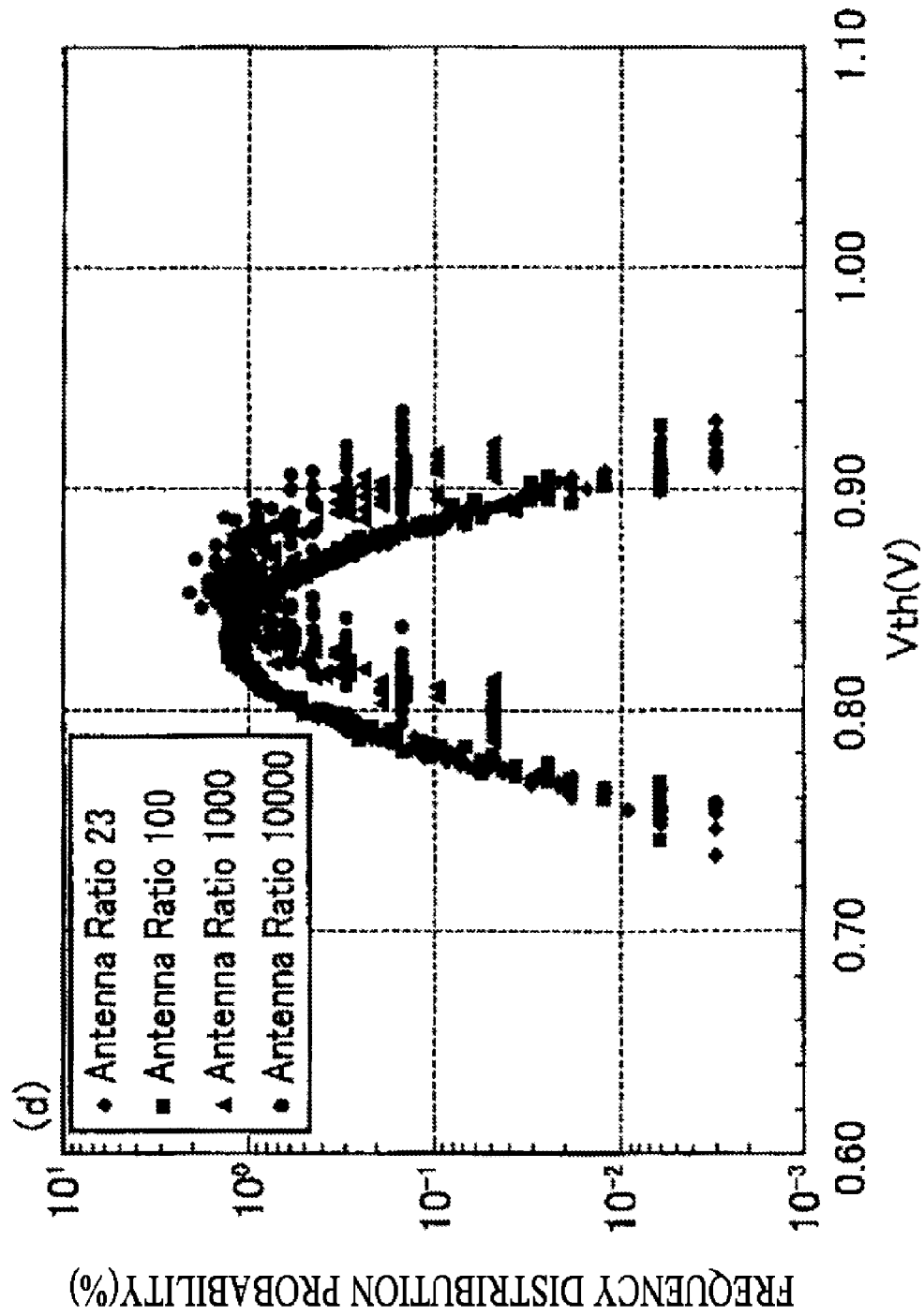
FIG. 12 is a graph showing a relationship between Vth shift deviation and a frequency distribution probability, in each antenna ratio in case of being manufactured according to a manufacturing method (d) of performing both an etching process and a CVD process using microwave plasma.

FIG. 9 is a graph showing a relationship between a Vth shift deviation and a frequency distribution probability with respect to each antenna ratio of a semiconductor device processed by using plasma corresponding to the example a according to the conventional technology (ICP). In FIG. 9, the vertical axis indicates a frequency distribution probability (%), and the horizontal axis indicates the threshold value voltage Vth (V). FIG. 10 shows the example b of patterning only the metal wiring layer 24 of the first layer by performing the etching process using microwave plasma, FIG. 11 shows the example c of forming only the interlayer insulation film 25 of FIG. 1 by performing the CVD process using microwave plasma, and FIG. 12 shows the example d of performing both operations, i.e., patterning the metal wiring layer 24 of the first layer by performing the etching process using microwave plasma, and forming the interlayer insulation film 25 by performing the CVD process using microwave plasma, wherein each of FIGS. 10 through 12 corresponds to FIG. 9. In FIGS. 9 through 12, a size of a gate is 0.24 μm×0.30 μm and the number of samples is 32768 when an antenna ratio is 23, 16384 when an antenna ratio is 100, 2048 when an antenna ratio is 1000, and 672 when an antenna ratio is 10000.

Referring to FIGS. 9 through 12, in the example a according to the conventional technology, when antenna ratios are different, frequency distribution probabilities are largely different, whereas in the examples b of patterning only the metal wiring layer 24 of the first layer by performing the etching process using microwave plasma, c of forming only the interlayer insulation film 25 of FIG. 1 by performing the CVD process using microwave plasma, and d of performing both operations, i.e., patterning the metal wiring layer 24 of the first layer by performing the etching process using microwave plasma, and forming the interlayer insulation film 25 by performing the CVD process using microwave plasma, differences between the frequency distribution probabilities are relatively small even when antenna ratios are different.

Figure 13:
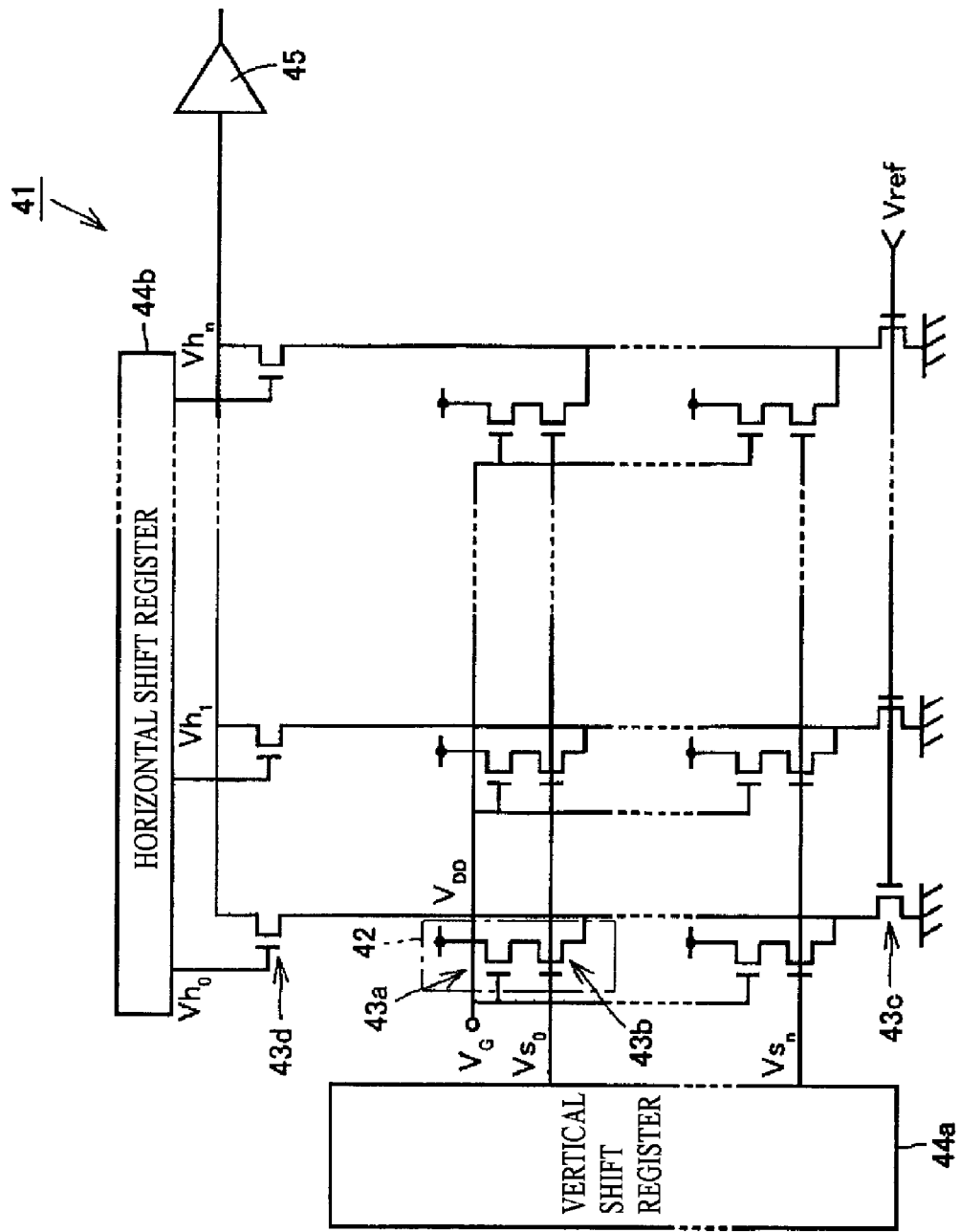
FIG. 13 is a circuit diagram showing a test element group (TEG) for evaluating the characteristics of a semiconductor device.

Next, a method of evaluating charge-up damage will now be described. FIG. 13 is a circuit diagram of the TEG 41 for evaluating charge-up damage. A plurality of TEGs 41 of FIG. 13 are arranged on a wafer (not shown), and evaluate charge-up damage by reading a threshold value voltage Vth.

Referring to FIG. 13, the TEG 41 includes a plurality of unit cells 42 arranged in columns and rows. In each unit cell 42, a row address is assigned according to row address signals $Vs_O$ through $Vs_n$ output from a vertical shift register 44a.

Each unit cell 42 includes two n-channel MOS transistors 43a and 43b connected in series. The n-channel MOS transistor 43a is a transistor to be measured with an antenna ratio, and the n-channel MOS transistor 43b is a row switch transistor.

Since a threshold value voltage Vth of a gate of the n-channel MOS transistor 43a changes according to an electron current or an ion current by collecing the electron current or the ion current flowing from plasma, the charge-up may be evaluated by reading the threshold value voltage Vth.

A gate voltage $V_G$ is applied to the gate of the n-channel MOS transistor 43a, and a row addressing signal from the vertical shift register 44a is applied to a gate of the n-channel MOS transistor 43b. A power supply voltage $V_{DD}$ is applied to a drain of the n-channel MOS transistor 43a, and a source of the n-channel MOS transistor 43a and a drain of the n-channel MOS transistor 43b are connected. A source of the n-channel MOS transistor 43b is connected to a drain of an n-channel MOS transistor 43c which functions as a current source transistor, and to a source of an n-channel MOS transistor 43d. The n-channel MOS transistor 43d is a column switch transistor. A reference voltage Vref is applied to a gate of the n-channel MOS transistor 43c, and a source of the n-channel MOS transistor 43c is grounded. A column address signal from a horizontal shift register 44b is applied to a gate of the n-channel MOS transistor 43d. A drain of the n-channel MOS transistor 43d is connected to an input of an output amplifier 45, and a threshold value voltage Vth of the n-channel MOS transistor 43a which is a transistor to be measured is extracted by the output amplifier 45 as an output voltage Vout.

An operation of the TEG 41 will now be described. When a vertical address signal $Vs_1$ is output from the vertical shift register 44a, the n-channel MOS transistor 43b is conducted. The gate of the n-channel MOS transistor 43a which is a transistor to be measured collects an electron current or an ion current flowing from plasma. A drain current Ids (=Iref) of the n-channel MOS transistor 43b is controlled according to the gate voltage Vref of the n-channel MOS transistor 43c which functions as a current source. Here, a voltage Vgs between the gate and the source of the n-channel MOS transistor 43a when Iref is 1 μA is defined to be a threshold value voltage Vth. The threshold value voltage Vth of the n-channel MOS transistor 43a is output from the drain to the source of the n-channel MOS transistor 43b. When the column address signal is output from the horizontal shift register 44b, the n-channel MOS transistor 43d is conducted and the threshold value voltage Vth is input to the output amplifier 45 through the source from the drain of the n-channel MOS transistor 43d, and thus the threshold value voltage Vth is extracted as the output voltage Vout from the output amplifier 45. The output voltage Vout is indicated as Vout=$V_G$–Vgs. When the gate voltage $V_G$ and the reference voltage Vref have fixed values, the threshold value voltage Vth may be obtained from the output voltage Vout.

By sequentially assigning addresses of the plurality of unit cells 42 in each of column directions and row directions by using the vertical shift register 44a and the horizontal shift register 44b, the output voltage Vout corresponding to a threshold value voltage of a corresponding transistor to be measured may be extracted from each unit cell 42. Also, by adding the output voltage extracted from each unit cell 42, an evaluation value of the TEG 41 may be outputted.

Figure 14:
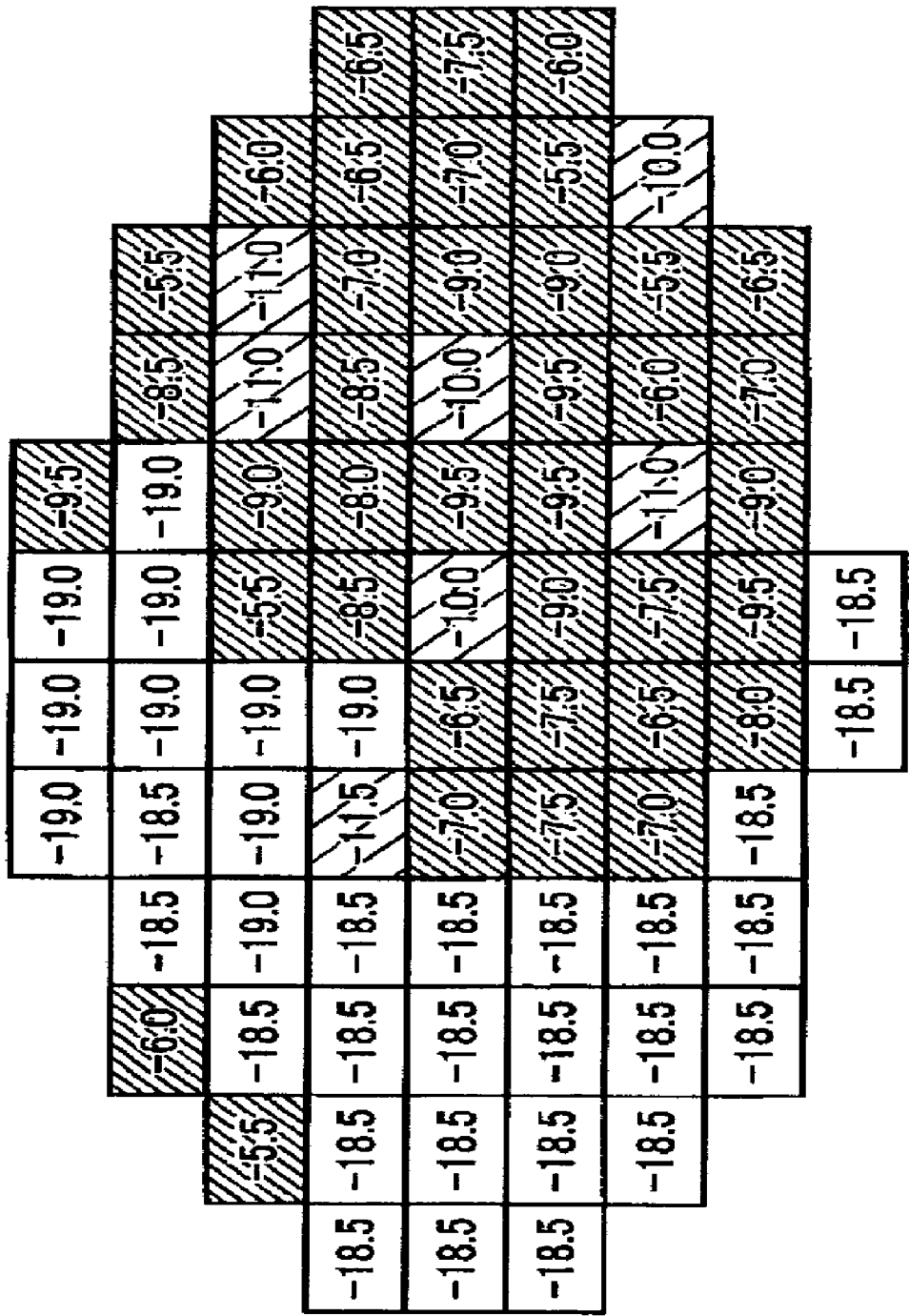
FIG. 14 is a diagram showing plasma charge-up damage of a semiconductor device manufactured according to a conventional manufacturing method.
Figure 15:
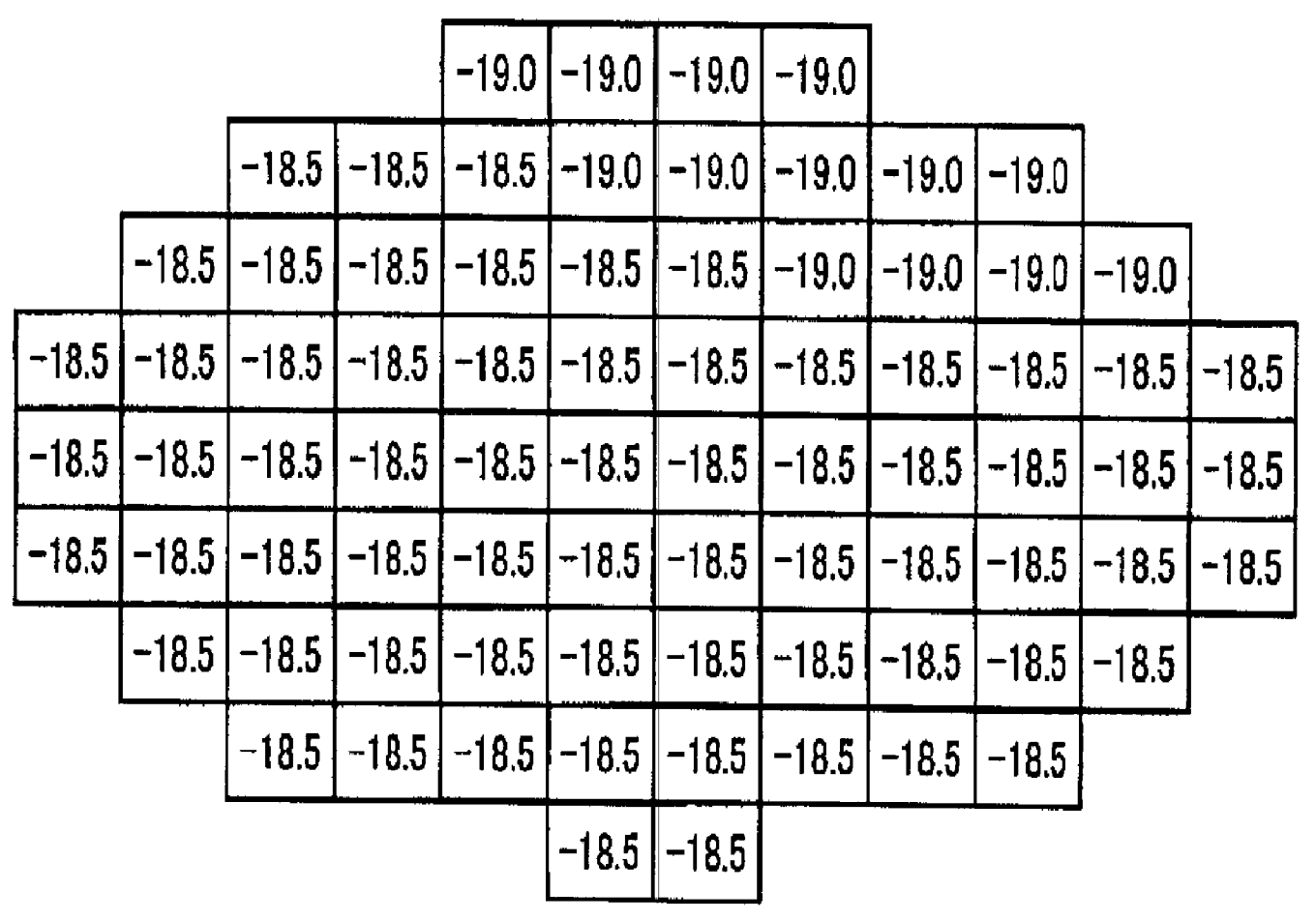

FIG. 14 is a diagram showing an example of evaluating by using the TEG plasma damage when processed with conventional plasma (ICP), and FIG. 15 is a diagram showing an example of evaluating by using the TEG plasma damage when processed with microwave plasma according to an embodiment of the present invention.

In FIGS. 14 and 15, the TEGs 41 described with reference to FIG. 13 are disposed on a wafer (not shown). Numbers shown on each TEG 41 are an output voltage Vout as an evaluation value with the unit in MV. Also, an area of a gate of a transistor to be measured in each TEG 41 is 2.5 μm×2.4 μm, Tox is 4 nm, a decision current is $1×10^{-6}$ A, and an antenna ratio is 1 M.

As can be seen by comparing FIGS. 14 and 15, an output voltage Vout is from −18.5 to 10.0 in an area with low plasma damage in FIG. 14, but an output voltage Vout is from −7.0 to −9.0 in an area with large plasma damage in FIG. 14. However, in FIG. 15, an output voltage Vout is from −18.5 to −19.0 in all areas, and thus plasma damage scarcely occurs.

Figure 16:
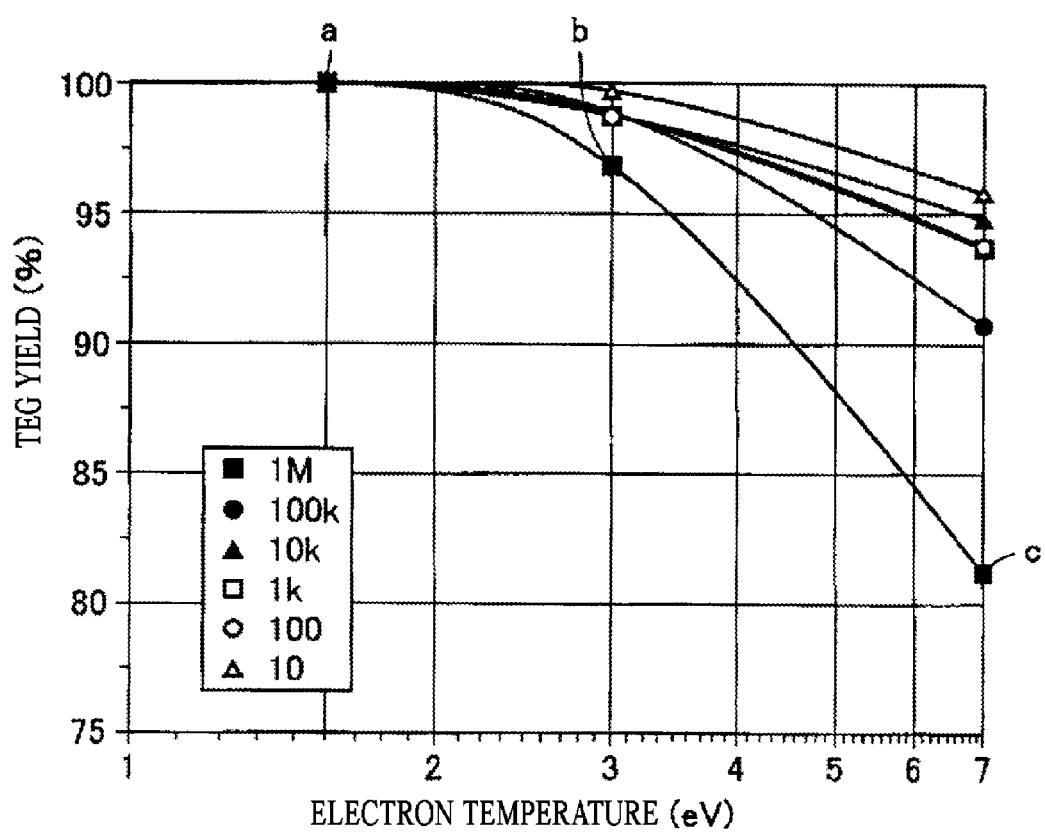
FIG. 16 is a graph showing a relationship between an electron temperature and a TEG yield.

FIG. 16 is a graph showing a relationship between an electron temperature and a TEG yield. In FIG. 16, the vertical axis indicates the TEG yield (%), i.e., the proportion of TEGs not subjected to plasma damage, and the horizontal axis indicates the electron temperature (eV). Here, $N_2$ plasma is used under pressure of 20 mTorr, and $N_2$ gas flows at a rate of 1000 sccm and Ar gas flows at a rate of 100 sccm while an output power is 3 kW and bias power is 0 W. Each antenna ratio is shown in FIG. 16. Here, when the plasma processing apparatus 31 of FIG. 2 is used, an electron temperature is 7 eV when a distance between the antenna unit 33 and the susceptor 34 is 15 mm, 3 eV when the distance is 25 mm, and 1.5 eV when the distance is 55 mm. Also, an electron density is $3.7×10^{11}$ $cm^{-3}$ when the distance between the antenna unit 33 and the susceptor 34 is 15 mm, $3.9×10^{11}$ $cm^{-3}$ when the distance is 25 mm, and $3.4×10^{11}$ $cm^{-3}$ when the distance is 55 mm, and thus these electron densities are all high and almost similar to each other.

Figure 17:
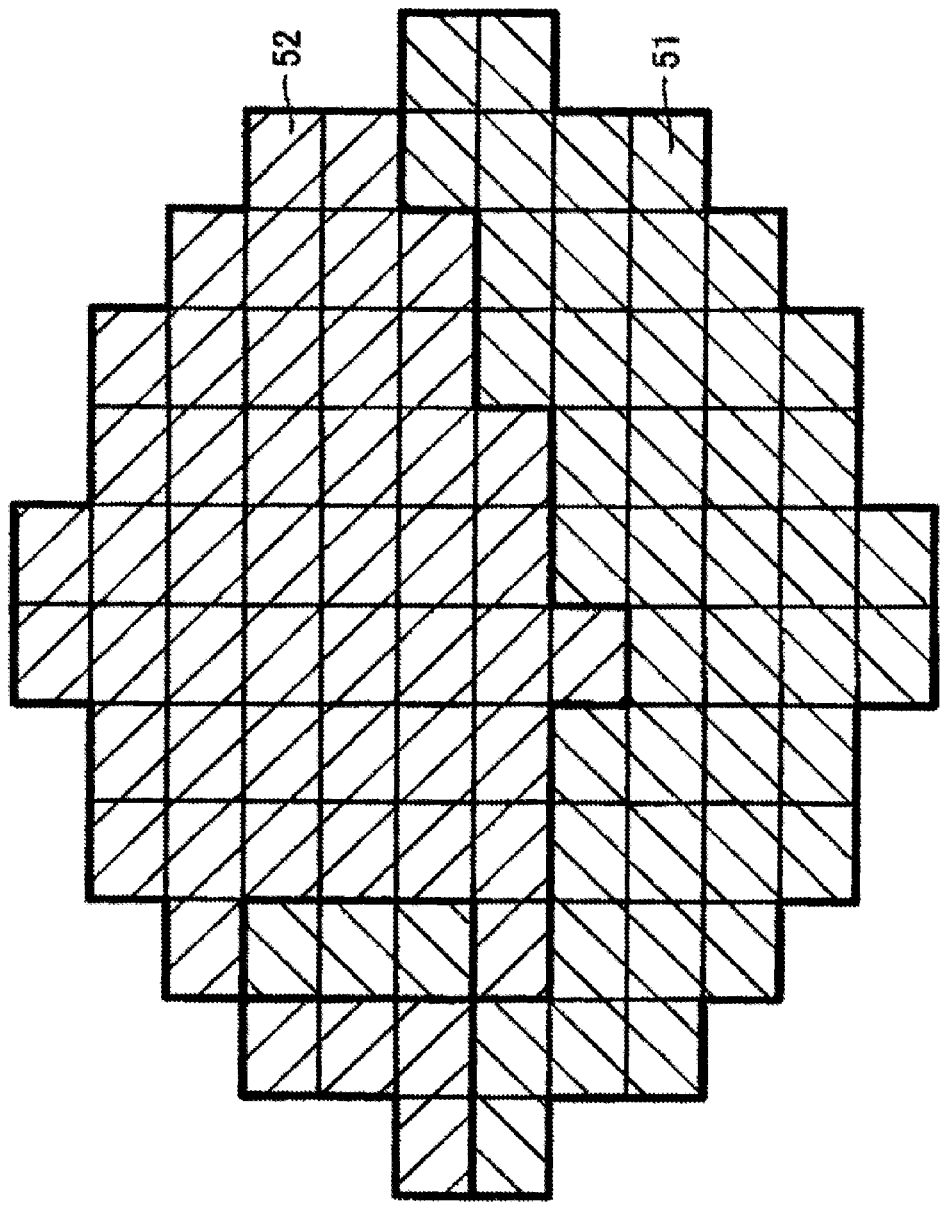
FIG. 17 is a diagram showing plasma damage of a TEG of antenna ratio 1 M evaluated at an electron temperature of 1.5 eV.
Figure 18:
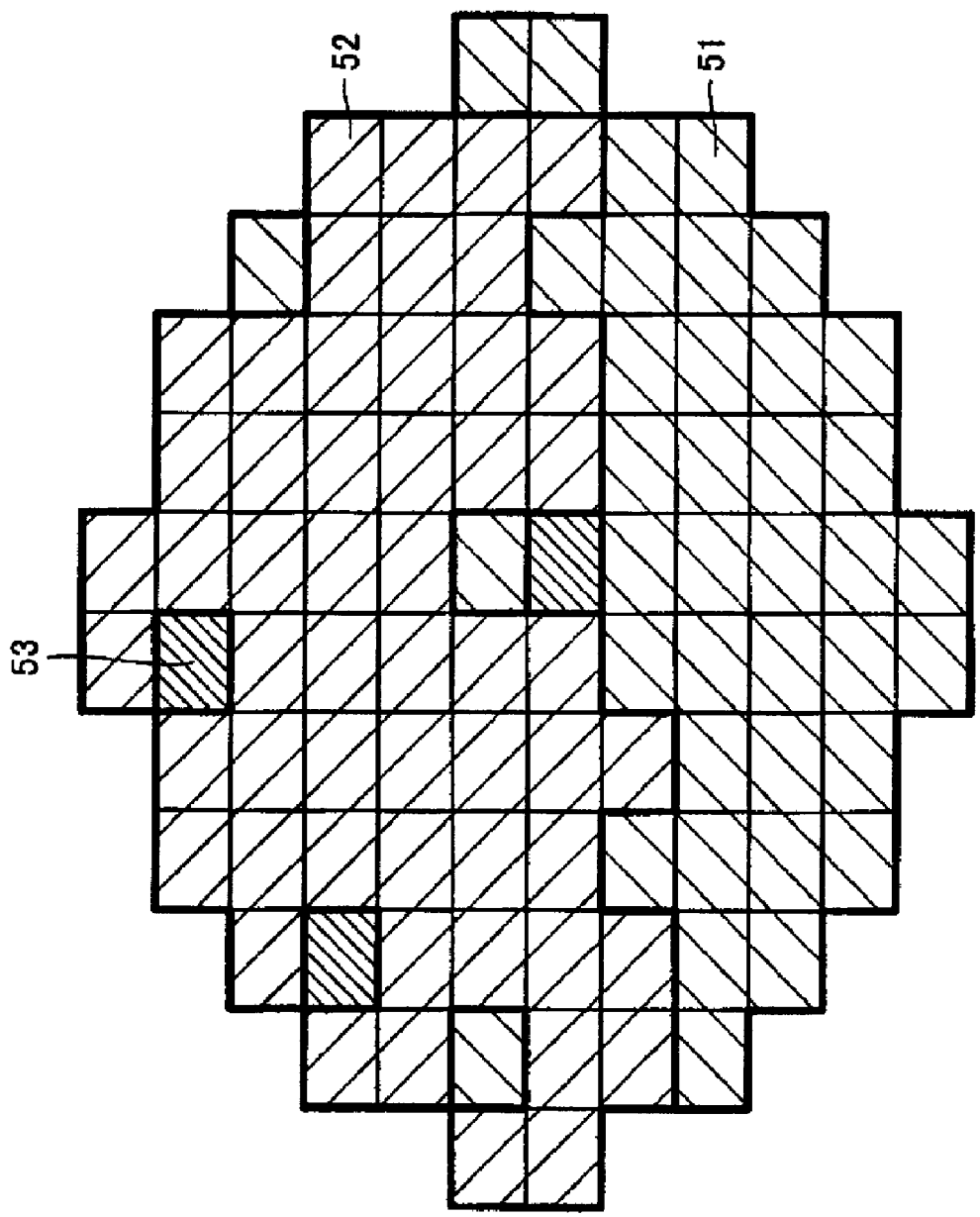
FIG. 18 is a diagram showing plasma damage of a TEG of antenna ratio 1 M at evaluated an electron temperature of 3 eV.
Figure 19:
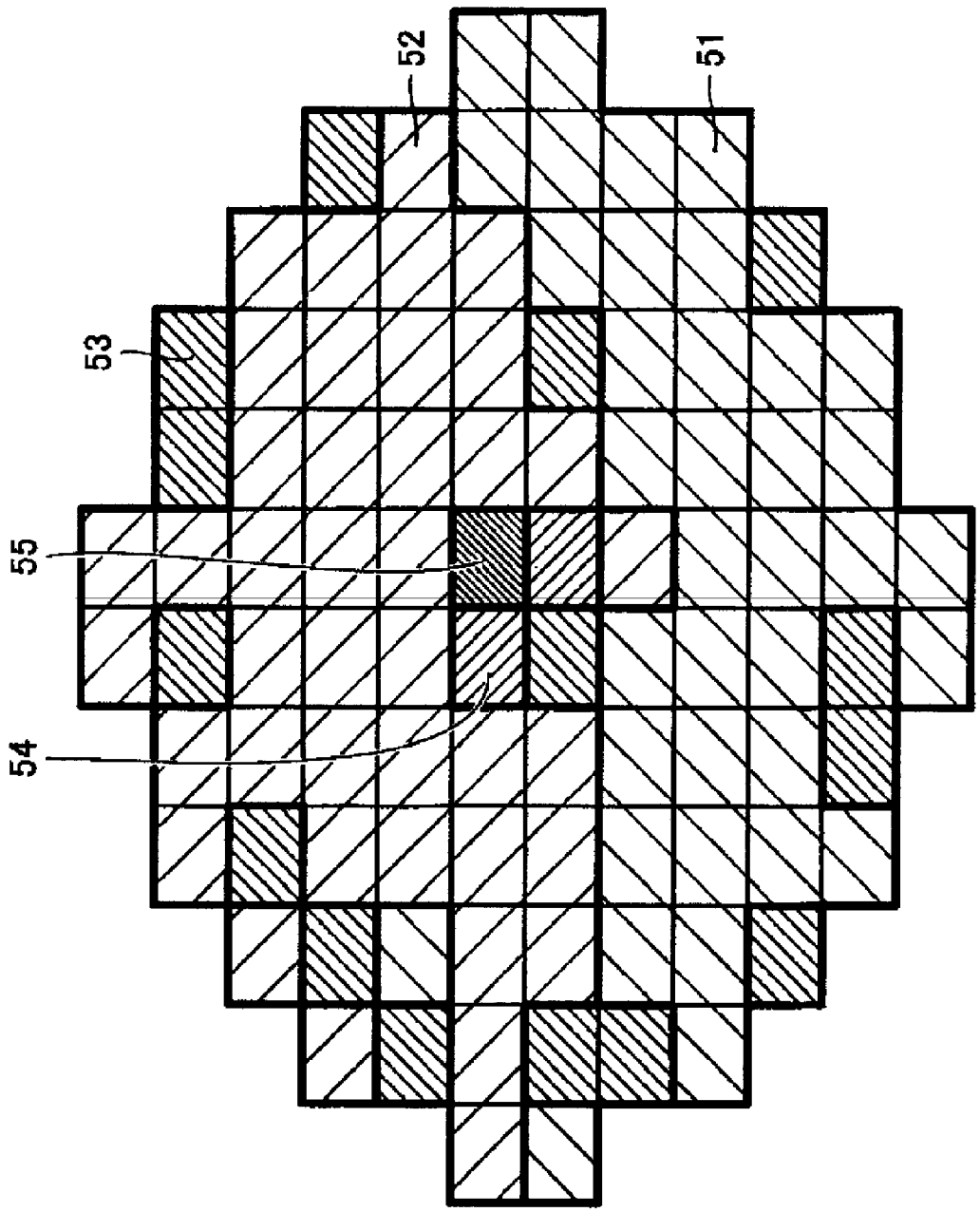
FIG. 19 is a diagram showing plasma damage of a TEG of antenna ratio 1 M at evaluated an electron temperature of 7 eV.

FIG. 17 is showing a plasma damage of a TEG of antenna ratio 1 M evaluated at a point 'a' of FIG. 16, i.e., when electron temperature is 1.5 eV. FIG. 18 is showing plasma damage of a TEG of antenna ratio 1 M evaluated at a point 'b' of FIG. 16, i.e., when the electron temperature is 3 eV. FIG. 19 is showing plasma damage of a TEG of antenna ratio 1 M evaluated at a point 'c' of FIG. 16, i.e., when the electron temperature is 7 eV. Referring to FIGS. 17 through 19, areas 51 and 52 are areas with low plasma damage, and areas 53, 54, and 55 are areas with high plasma damage.

Referring to FIGS. 16 through 19, when the electron temperature is 7 eV, portions not subjected to plasma damage are lower than 85%, and thus the semiconductor device is largely affected by plasma damage. Also, when the electron temperature is 3 eV, portions not subjected to plasma damage are lower than 95%. Meanwhile, when the electron temperature is 1.5 eV, portions not subjected to plasma damage are almost 100%. As such, by obtaining a low electron temperature and high electron density, plasma damage may be decreased.

As described above, according to the method of manufacturing a semiconductor device, an effect of plasma damage onto a semiconductor element during the manufacture may be reduced.

Also, in the above embodiments, a semiconductor element is a MOS transistor, but the present invention is not limited thereto, and the method may be used to manufacture a semiconductor device including a semiconductor element such as a CCD.

While this invention has been particularly shown and described with reference to exemplary embodiments thereof, it will be understood by those skilled in the art that various changes in form and details may be made therein without departing from the spirit and scope of the invention as defined by the appended claims.

INDUSTRIAL APPLICABILITY

A semiconductor device manufacturing method according to the present invention may be effectively used for manufacturing a semiconductor device, such as a large-scale integrated circuit (LSI).

The invention claimed is:

1. A semiconductor device manufacturing method using a plasma processing apparatus having an antenna unit and a holding stage which holds a semiconductor substrate, the method comprising:
   forming a semiconductor element on the semiconductor substrate, the semiconductor element having an antenna ratio of 1000 or above; and
   by using microwaves as a plasma source, forming a first insulation film on the semiconductor element by performing a CVD process using microwave plasma generated between the antenna unit and the holding stage,
   wherein a plasma diffusion area of the microwave plasma is in a range of 50 mm≦A≦120 mm (the A being a downward distance from the antenna unit), and has an electron temperature of plasma lower than 1.5 eV and an electron density of plasma higher than $1×10^{11}$ $cm^{-3}$ near a surface of the semiconductor substrate.

2. The method of claim 1, further comprising performing an etching process using the microwave plasma with respect to the first insulation film.

3. The method of claim 1, wherein the forming of the semiconductor element comprises:
   forming a second insulation film on the semiconductor substrate;
   forming a conductive layer on the second insulation film; and
   forming an electrode by patterning the conductive layer through an etching process using the microwave plasma.

4. A semiconductor device manufacturing method using a plasma processing apparatus having an antenna unit and a holding stage which holds a semiconductor substrate, the method comprising:
   forming a semiconductor element on the semiconductor substrate, the semiconductor element having an antenna ratio of 1000 or above;
   forming an insulation film on the semiconductor element; and
   by using microwaves as a plasma source, etching the insulation film by performing an etching process using microwave plasma generated between the antenna unit and the holding stage,
   wherein a plasma diffusion area of the microwave plasma is in a range of 50 mm≦A≦120 mm (the A being a downward distance from the antenna unit), and has an electron temperature of plasma lower than 1.5 eV and an electron density of plasma higher than $1×10^{11}$ $cm^{-3}$ near a surface of the semiconductor substrate.

5. A semiconductor device manufacturing method using a plasma processing apparatus having an antenna unit and a holding stage which holds a semiconductor substrate, the method comprising:
   forming a semiconductor element on the semiconductor substrate;
   forming an insulation film on the semiconductor element;
   forming a conductive layer on the insulation film; and
   by using microwaves as a plasma source, patterning the conductive layer by performing an etching process using microwave plasma generated between the antenna unit and the holding stage, wherein a plasma diffusion area of the microwave plasma is in a range of 50 mm≦A≦120 mm (the A being a downward distance from the antenna unit), and has an electron temperature of plasma lower than 1.5 eV and an electron density of plasma higher than $1\times10^{11}$ cm$^{-3}$ near a surface of the semiconductor substrate, thus forming a wiring layer having an antenna ratio of 1000 or above.

6. A semiconductor device manufacturing method using a plasma processing apparatus having an antenna unit and a holding stage which holds a semiconductor substrate, the method comprising:
  forming a gate insulation film on the semiconductor substrate;
  by using microwaves as a plasma source, forming a gate electrode on the gate insulation film by performing a patterning by an etching process using microwave plasma generated between the antenna unit and the holding stage, wherein a plasma diffusion area of the microwave plasma is in a range of 50 mm≦A≦120 mm (the A being a downward distance from the antenna unit), and has an electron temperature of plasma lower than 1.5 eV and an electron density of plasma higher than $1\times10^{11}$ cm$^{-3}$ near a surface of the semiconductor substrate;
  forming a pair of highly-concentrated impurity diffusion regions on the semiconductor substrate, thus forming a semiconductor element, wherein the gate insulation film is disposed therebetween; and
  forming a wiring layer which is connected to the semiconductor element, an antenna ratio of the wiring layer being 1000 or above.

7. The method of claim 6, further comprising:
  forming an insulation film on the semiconductor substrate on which the gate electrode is formed; and
  partly leaving a portion of the insulation film on a side wall of the gate electrode by performing an anisotropic etching process using the microwave plasma on the insulation film.

8. A plasma CVD processing method in which an insulation film is formed on a substrate by a microwave plasma in a chamber of a plasma processing apparatus having an antenna unit and a holding stage which holds the substrate, the method comprising:
  supplying a film-forming gas into the chamber; and
  generating the microwave plasma between the antenna unit and the holding stage from the film-forming gas, thus forming the insulation film on the substrate by the microwave plasma,
  wherein a plasma diffusion area of the microwave plasma is in a range of 50 mm≦A≦120 mm (the A being a downward distance from the antenna unit), and has an electron temperature of plasma lower than 1.5 eV and an electron density of plasma higher than $1\times10^{11}$ cm$^{-3}$ near a surface of the semiconductor substrate, and
  the insulation film is formed so that, when a semiconductor element is formed by forming the insulation film on the substrate by the microwave plasma, an antenna ratio of the semiconductor element is 1000 or more.

* * * * *